United States Patent
Wood et al.

(10) Patent No.: US 9,332,652 B2
(45) Date of Patent: May 3, 2016

(54) PROCESS FOR ETCHING A RECESSED STRUCTURE FILLED WITH TIN OR A TIN ALLOY

(75) Inventors: Neal Wood, Worcestershire (GB); Dirk Tews, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 402 days.

(21) Appl. No.: 13/979,914

(22) PCT Filed: Feb. 9, 2012

(86) PCT No.: PCT/EP2012/052181
§ 371 (c)(1),
(2), (4) Date: Jul. 16, 2013

(87) PCT Pub. No.: WO2012/126672
PCT Pub. Date: Sep. 27, 2012

(65) Prior Publication Data
US 2014/0000650 A1    Jan. 2, 2014

(30) Foreign Application Priority Data

Mar. 22, 2011 (EP) .................................... 11159179

(51) Int. Cl.
| | |
|---|---|
| C23G 1/02 | (2006.01) |
| H05K 3/26 | (2006.01) |
| C23F 1/40 | (2006.01) |
| H01L 21/321 | (2006.01) |
| H01L 21/3213 | (2006.01) |
| H05K 3/34 | (2006.01) |
| H01L 21/768 | (2006.01) |

(52) U.S. Cl.
CPC .. *H05K 3/26* (2013.01); *C23F 1/40* (2013.01);
*H01L 21/32115* (2013.01); *H01L 21/32134*
(2013.01); *H05K 3/3473* (2013.01); *H01L
21/7684* (2013.01); *H05K 2203/054* (2013.01);
*H05K 2203/0793* (2013.01)

(58) Field of Classification Search
None
See application file for complete search history.

(56) References Cited

U.S. PATENT DOCUMENTS

| | | | |
|---|---|---|---|
| 2,200,782 A | 5/1940 | Vollmer | |
| 3,677,949 A * | 7/1972 | Brindisi et al. ........... | C23F 1/44 216/108 |
| 4,397,753 A | 8/1983 | Czaja | |
| 4,687,545 A | 8/1987 | Williams et al. | |
| 5,993,559 A | 11/1999 | Singer et al. | |

OTHER PUBLICATIONS

English translation of Search Report for Chinese Patent Application No. 201280014050.4 issued Jan. 19, 2015.
PCT/EP2012/052181; PCT International Search Report and Written Opinion of the International Searching Authority dated Mar. 28, 2012.

* cited by examiner

*Primary Examiner* — Eric Golightly
(74) *Attorney, Agent, or Firm* — Renner, Otto, Boisselle & Sklar, LLP

(57) ABSTRACT

A process for etching excess tin or tin alloy deposits including the steps of providing a substrate having recessed structures filled with tin or a tin alloy and an excess layer of tin or tin alloy, providing an aqueous etching solution consisting of a source of hydroxide ions and a nitro-substituted aromatic sulfonic acid and having a pH value greater than 7, and contacting said substrate with said aqueous etching solution for removing said excess tin or tin alloy layer on top of the recessed structures filled with tin or a tin alloy.

8 Claims, 2 Drawing Sheets

Figure 1
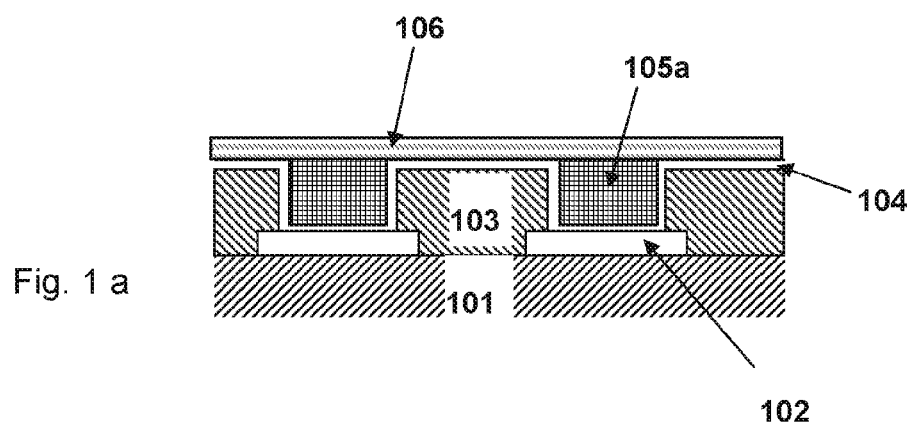
Fig. 1 a
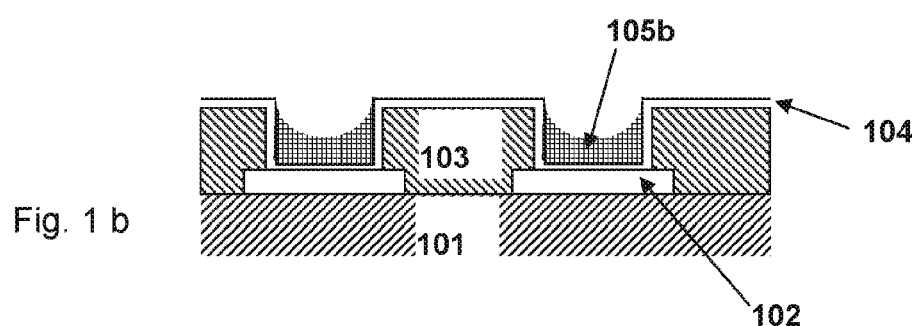
Fig. 1 b
PRIOR ART

Figure 2
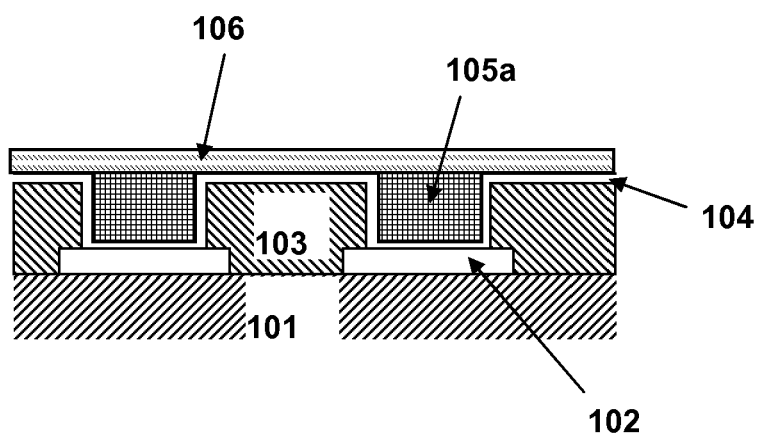
Fig. 2 a
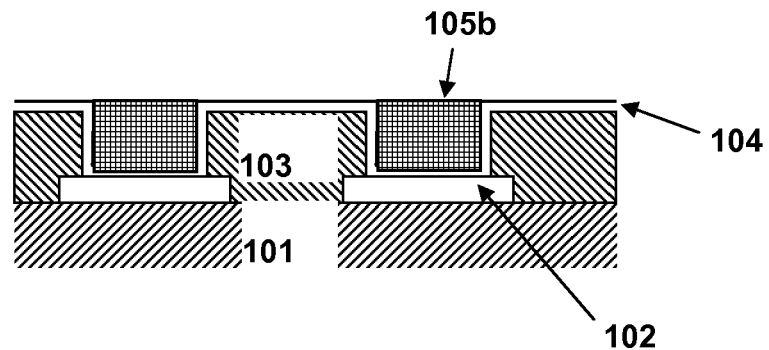
Fig. 2 b

PROCESS FOR ETCHING A RECESSED STRUCTURE FILLED WITH TIN OR A TIN ALLOY

The present application is a U.S. National Stage Application based on and claiming benefit and priority under 35 U.S.C. §371 of International Application No. PCT/EP2012/052181, filed 9 Feb. 2012, which in turn claims benefit of and priority to European Application No. EP 11159179.8, filed 22 Mar. 2011, the entirety of each of which is hereby incorporated herein by reference.

FIELD OF THE INVENTION

The present invention relates to the manufacture of printed circuit boards, IC substrates and the like, more particularly to the etching of tin and tin alloys.

BACKGROUND OF THE INVENTION

Tin and tin alloys have been used as solderable surface or solder material in the manufacture of electronic devices such as printed circuit boards (PCB) and IC substrates since a long time.

A more recent development is the deposition of tin and tin alloys as a solder material by electroplating into recessed structures of an electronic device. The tin or tin alloy deposit can be either plated by pattern plating or panel plating.

A panel plating method for manufacture of solder deposits is disclosed in EP 2180770 A1.

A substrate surface having bonding pads made of e.g. copper is coated with a solder mask material and openings are formed into the solder mask material to expose the bonding pads. Such openings are referred herein as recessed structures. Other types of recessed structures are formed through the dielectric substrate of an electronic device, to a resist material or through more than one of such layers.

Next, a conductive seed layer is deposited onto the whole surface of the substrate and the surface of the recessed structures. Tin or a tin alloy is then deposited by electroplating onto the conductive seed layer in order to fill the recessed structures.

However, when filling the recessed structures completely with tin or a tin alloy a certain amount of tin or tin alloy is deposited at the same time onto the surface of the conductive seed layer which is not covering the recessed structures. Such an excess layer of tin or a tin alloy is always required for a complete filling of the recessed structures.

Next, said excess tin or a tin alloy on top of the recessed structures filled with tin or a tin alloy is removed.

This task can be achieved by depositing an etch resist onto the surface of the tin or tin alloy which is aligned with the recessed structures followed by etching away the excess layer of tin or a tin alloy not covered by the etch resist. Such a process is disclosed in US 2006/0219567 A1. The drawbacks of this method are manifold: a) the resulting recessed structures filled with tin or a tin alloy have a height exceeding that of the surrounding solder mask material. This leads to misalignment of solder material deposited by (screen-)printing of additional solder material in successive process steps and b) such a process requires several more process steps.

The panel plating method for manufacture of solder deposits disclosed in EP 2180770 A1 requires an etching solution for tin or tin alloys which is controllable to such an extend that no etch resist is required. The etching attack must be very homogenous to lead to a smooth and planar surface of the recessed structures filled with tin or a tin alloy when removing the excess layer of tin or tin alloy.

Aqueous etching solutions for tin and tin alloys known in the art (Jordan: The Electrodeposition of Tin and its Alloys, 1995, p. 373-377) fail in a way that tin or a tin alloy plated into a recessed structure is removed at a higher speed than the excess tin or tin alloy layer on top of the solder mask material. The result are dimples in the recessed structures filled with tin or a tin alloy (FIG. 1). Such dimples must be avoided as they lead in later process steps to solder joints which are not stable and reliable.

OBJECTIVE OF THE PRESENT INVENTION

It is therefore the objective of the present invention to provide a process for planarization of recessed structures filled with tin or a tin alloy which avoids the formation of dimples.

It is a second objective of the present invention to provide recessed structures filled with planarised tin or tin alloy solder deposits for the manufacture of stable and reliable solder joints.

SUMMARY OF THE INVENTION

These objectives are solved by a process for etching excess tin and tin alloy deposits comprising the steps
a. providing a substrate having recessed structures filled with tin or a tin alloy and an excess layer of tin or tin alloy,
b. providing an aqueous etching solution consisting of a source of hydroxide ions and a nitro-substituted aromatic sulfonic acid and having a pH value greater than 7,
c. contacting said substrate with said aqueous etching solution for removing said excess tin or tin alloy layer on top of said recessed structures filled with tin or a tin alloy.

BRIEF DESCRIPTION OF THE FIGURES

FIG. 1 shows the etching of a recessed structure filled with tin as obtained from an etching method known from prior art.
FIG. 2 shows the etching of a recessed structure filled with tin according to the present invention.

DETAILED DESCRIPTION OF THE INVENTION

The substrate (101) comprises bonding pads (102) made e.g. of copper and a solder mask material (103) with openings exposing the bonding pads (102). A conductive seed layer (104) comprising copper covers the surface of the solder mask material (103) and the bonding pads (102). The openings are filled with tin or a tin alloy and resemble to the recessed structures filled with tin or a tin alloy (105a) and an excess layer of tin or a tin alloy (106) above the filled recessed structures (105a) and on top of the solder mask material (103).

The excess tin or tin alloy layer (106) is contacted with an aqueous etching solution consisting of a source of hydroxide ions and a nitro-substituted aromatic sulfonic acid and having a pH value greater than 7. The pH value ranges from 7 to 14, more preferably from 11 to 14.

The source of hydroxide ions is selected from the group consisting of LiOH, NaOH, KOH, $NH_4OH$ and organic hydroxide sources such as ethanolamine, diethanolamine and triethanolamine, and mixtures thereof. The most preferred source of hydroxide ions is NaOH. The concentration of hydroxide ions ranges from 0.5 to 100 g/l, more preferably from 10 to 40 g/l and most preferably from 20 to 30 g/l.

The nitro-substituted aromatic sulfonic acid is preferably selected from the group consisting of o-nitrobenzene sulfonic acid, m-nitrobenzene sulfonic acid, p-nitrobenzene sulfonic acid and their corresponding salts with sodium and potassium and mixtures thereof. The concentration of the nitro-substituted aromatic sulfonic acid, salt thereof and mixtures thereof ranges from 1 to 100 g/l, more preferably from 20 to 80 g/l and most preferably from 40 to 60 g/l.

The aqueous etching solution may further contain a wetting agent. Preferably the wetting agent is selected from the group comprising alkylated or arylated ethyleneoxide-propyleneoxide-co-polymers, alkylsulfates, alkylsulfonates, arylalkylsulfonates and low foaming nonionic or anionic surfactants.

The temperature of the aqueous etchant is held in the range of 20 to 90° C., more preferably 30 to 70° C. during step c.

The substrate is contacted with the aqueous etching solution for 10 to 240 s, more preferably 60 to 120 s in step c.

The substrate can be contacted with the aqueous etching solution by dipping the substrate into the aqueous etching solution, by horizontal flood processing of the substrate with the aqueous solution or by spraying the aqueous etching solution onto the substrate. The most preferred method for contacting the substrate with the aqueous etching solution is by horizontal processing with either spray or flood application.

When subjected to electroplating a substrate having recessed structures shows a wide range of current densities, especially when electroplating tin or a tin alloy into the recessed structures and on top of such a substrate. The result of the wide current density range during electroplating is a non homogeneous grain structure of the as deposited tin or tin alloy. The grain size inside a recessed structure and on top of such a recessed structure is considerably larger than that on top of the solder mask material. Aqueous etching solutions known in the art attack larger sized grains of tin or a tin alloy much faster than small sized grains.

The result of an etching procedure with etching solutions for tin and tin alloys known in the art is shown in FIG. 1. Dimples in the recessed structures filled with tin or a tin alloy having a larger grain size are formed due to the faster etch attack on larger sized grains. Such dimples in the recessed structures filled with tin or a tin alloy are not acceptable and lead to solder joints in successive process steps which are not stable and reliable.

The process according to the present invention leads to a uniform etch attack on tin and tin alloy deposits independent of the grain size. The result of the process according to the present invention is shown in FIG. 2. Due to the uniform etch attack no undesired dimples are formed in the recessed structures filled with tin or a tin alloy.

EXAMPLES

The invention will now be illustrated by reference to the following non-limiting examples.

The substrates used throughout the examples comprise recessed structures of cylindrical shape with a diameter of 100 μm and a depth of 30 μm. The walls of the recessed structures are composed of copper bonding pads 102 (bottom) and a solder mask material 103 (side walls).

A conductive seed layer 104 made of copper was deposited into the recessed structures and on top of the solder mask material 103. Next, the recessed structures were filled with tin 105a by electroplating. For a complete filling of the recessed structures it is required to plate an excess tin or tin alloy layer 106 (panel plating).

The excess tin layer 106 was removed by different aqueous etching solutions as described below.

Cross-sections of the substrates treated with the different etching solutions were investigated with an optical microscope. The dimple was used as a measure for etching of the excess tin or tin alloy layer (106). The dimple is quantified by measuring the distance between the top of a recessed structure and the top of the tin or tin alloy deposit in the recessed structure. The distance was measured in the centre of the recessed structure. A dimple is a failure which must be avoided.

Example 1 (Comparative)

An acidic aqueous etching solution consisting of 50 g/l of nitric acid and 50 g/l ferric nitrate nonahydrate was used. The substrate was immersed in the aqueous etching solution for 60 s at a temperature of 30° C. The excess layer of tin 106 was completely removed.

The recessed structure filled with tin 105b has a dimple of 20 μm. Hence, a stable and reliable solder joint can not be archived.

Example 2 (Comparative)

An acidic aqueous etching solution consisting of 50 g/l methane sulfonic acid and 50 g/l meta-nitro benzene sulfonic acid sodium salt was used. The substrate was immersed in the aqueous etching solution for 60 s at a temperature of 30° C. The excess layer of tin 106 was completely removed.

The recessed structure filled with tin 105b has a dimple of 20 μm. Hence, a stable and reliable solder joint can not be archived.

Example 3 (Invention)

An alkaline aqueous etching solution consisting of 50 g/l sodium hydroxide and 50 g/l meta-nitro benzene sulfonic acid sodium salt was used. The substrate was immersed in the aqueous etching solution for 60 s at a temperature of 50° C. The excess layer of tin 106 was completely removed.

The recessed structure filled with tin 105b shows no dimple. Hence, a stable and reliable solder joint can be archived.

The invention claimed is:

1. A process for manufacture of a printed circuit board or an integrated circuit, comprising
    depositing tin or a tin alloy on a substrate to fill recessed structures and forming an excess layer of tin or tin alloy, and then etching away the excess layer of tin or tin alloy comprising the steps of
    a. providing the substrate having the recessed structures filled with tin or a tin alloy and the excess layer of tin or tin alloy,
    b. providing an aqueous etching solution consisting of a source of hydroxide ions and a nitro-substituted aromatic sulfonic acid and having a pH value greater than 7,
    c. contacting said substrate with said aqueous etching solution at a temperature of 30 to 70° C. for a time ranging from 60 seconds to 120 seconds for removing said excess tin or tin alloy layer on top of said recessed structures filled with tin or a tin alloy, wherein the contacting is sufficient to remove only the excess layer of tin or tin alloy but not to form dimples in the tin or tin alloy filling the recessed structures.

2. A process according to claim 1 wherein the source of hydroxide ions is selected from the group consisting of LiOH, NaOH, KOH and $NH_4OH$.

3. A process according to claim 1 wherein the concentration of hydroxide ions ranges from 20 to 30 g/l.

4. A process according to claim 1 wherein the nitro-substituted aromatic sulfonic acid is selected from the group consisting of o-nitrobenzene sulfonic acid, m-nitrobenzene sulfonic acid, p-nitrobenzene sulfonic acid and mixtures thereof.

5. A process according to claim 1 wherein the concentration of the nitro-substituted aromatic sulfonic acid ranges from 30 to 60 g/l.

6. A process according to claim 1 wherein the pH value ranges from 11 to 14.

7. A process according to claim 1 wherein the aqueous etching solution further contains a wetting agent.

8. A process according to claim 1 wherein the substrate is contacted with the aqueous etching solution by horizontal processing with spray or flood application.

* * * * *